(12) United States Patent
West

(10) Patent No.: US 8,724,266 B2
(45) Date of Patent: May 13, 2014

(54) PHOTOVOLTAIC SWITCHGEAR WITH SACRIFICIAL FUSE

(75) Inventor: Richard Travis West, Ragged Point, CA (US)

(73) Assignee: Renewable Power Conversion, Inc., San Luis Obispo, CA (US)

( * ) Notice: Subject to any disclaimer, the term of this patent is extended or adjusted under 35 U.S.C. 154(b) by 0 days.

(21) Appl. No.: 13/565,326

(22) Filed: Aug. 2, 2012

(65) Prior Publication Data

US 2014/0034613 A1 Feb. 6, 2014

(51) Int. Cl.
*H02H 3/087* (2006.01)

(52) U.S. Cl.
USPC ............................................. 361/2

(58) Field of Classification Search
USPC ...................................... 361/2, 126
See application file for complete search history.

(56) References Cited

U.S. PATENT DOCUMENTS

| | | | | | |
|---|---|---|---|---|---|
| 3,192,440 | A | * | 6/1965 | Baltensperger | 361/13 |
| 3,877,040 | A | * | 4/1975 | Watanabe | 396/252 |
| 4,392,172 | A | * | 7/1983 | Foley et al. | 361/8 |
| 4,482,854 | A | * | 11/1984 | Kawada et al. | 318/801 |
| 5,701,118 | A | * | 12/1997 | Hull et al. | 340/638 |
| 5,737,162 | A | * | 4/1998 | Ito et al. | 361/8 |
| 5,835,002 | A | * | 11/1998 | Barnett | 337/143 |
| 7,261,962 | B1 | * | 8/2007 | Czajkowski et al. | 429/423 |
| 8,335,060 | B2 | * | 12/2012 | Bang et al. | 361/2 |
| 2005/0002152 | A1 | * | 1/2005 | Gemme et al. | 361/626 |
| 2008/0130180 | A1 | * | 6/2008 | de Palma et al. | 361/56 |

FOREIGN PATENT DOCUMENTS

EP 620575 A1 * 10/1994

* cited by examiner

*Primary Examiner* — Rexford Barnie
*Assistant Examiner* — Ann Hoang

(57) ABSTRACT

The invention is a photovoltaic-specific, DC load-break disconnect switch intended for applications where load-break capability is only required under abnormal operating conditions or in an emergency due to the catastrophic failure or other system components. Under normal operating conditions, the load will be switched off before a DC disconnect switch is opened. Under conditions where a load-break disconnect operation is required, an alternate path is automatically provided through a sacrificial fuse to divert current from opening contacts such that the fuse interrupts the current and not the contacts, thereby providing a substantially arcless load break. The current rating of the sacrificial fuse may be orders of magnitude less than the normal carry current. Equipment based on this invention will provide a one-time load break function that is renewable by the replacement of a fuse. The invention leverages the superior, cost-effective fault clearing capability of fuses in DC applications.

8 Claims, 2 Drawing Sheets

US 8,724,266 B2

PHOTOVOLTAIC SWITCHGEAR WITH SACRIFICIAL FUSE

BACKGROUND OF THE INVENTION

In order to achieve cost parity with other power sources, photovoltaic power plants must become more cost effective. One way to reduce costs is to raise the DC input voltage and the AC grid-tie voltages of photovoltaic power converters. The technology is currently available to produce these higher performance power converters but the lack cost effective, higher voltage DC switchgear required to support power converter operation at higher photovoltaic source voltages remains a significant barrier.

Prior art solutions for managing contact arcing in high power DC switchgear include; hermetically sealed vacuum contacts, arc shoots, magnetic blowouts, blowout coils, hybrid semiconductor assisted switching and multiple series contact sets.

BRIEF SUMMARY OF THE INVENTION

The invention is a photovoltaic-specific, DC load-break disconnect switch intended for applications where load-break capability is only required under abnormal operating conditions or in an emergency due to the catastrophic failure of other system components.

Under normal operating conditions, the power converter "load" will be switched off before a DC disconnect switch is opened.

Under conditions where a load-break disconnect operation is required, an alternate path is automatically provided through a sacrificial fuse to divert current from opening contacts such that the fuse interrupts the current and not the contacts, thereby providing an arcless load break at the disconnect switch contacts. The current rating of the sacrificial fuse may be orders of magnitude less than the normal switch carry current. Equipment based on this invention will provide a one-time load break function that is renewable by the replacement of a fuse. The invention leverages the superior, cost-effective fault clearing capability of fuses in DC applications.

The proposed invention is based on, off-the-shelf AC rated safety switch mechanisms augmented with a novel arrangement of sacrificial fuses and passive voltage clamps to provide DC load break capabilities not currently available at less than five times the cost of prior art DC load break switchgear, if at all.

DETAILED DESCRIPTION OF THE INVENTION

Figure 1:
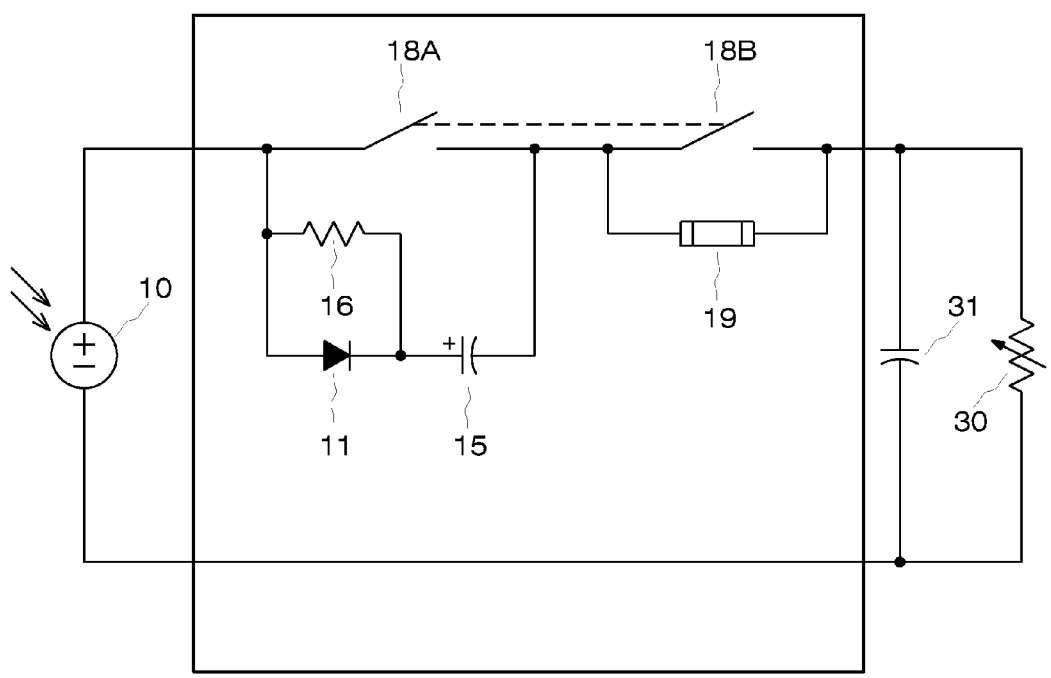
FIG. 1 is an electrical schematic of the most basic embodiment of the invention as a composite single-pole DC load-break safety switch.

FIG. 1 shows a schematic for the most basic embodiment of the invention as a disconnect isolation or "safety" switch connected between solar photovoltaic source 10 and loads 30 and 31. Capacitive load 31 is modeled as the DC buss capacitance of a typical photovoltaic DC-to-AC power converter. The value of resistive load 30 is a function of the power being processed by the DC-to-AC power converter. The switch comprises elements 11, 15, 16, 18A, 18B and 19. SPST switch contacts 18A and 18B are switched together and are controlled by a manually operated lever. In the intended application, as a solar photovoltaic array disconnect switch, the switch will be opened under either non-load break conditions, where load 30 is essentially infinite, and no current is flowing through the switch or under load-break emergency conditions where current is flowing through contacts 18A and 18B prior to opening the switch. Under said non-load break conditions, the voltage of photovoltaic source 10 is the same as the voltage on capacitor 31 such that when switch contacts 18A and 18B are opened, no current flows from photovoltaic source 10. Under emergency load-break conditions when contacts 18A and 18B are opened, current will flow through diode 11, capacitor 15 and fuse 19 as capacitor 15 charges from zero volts to the open circuit voltage of photovoltaic source 10 less the voltage across capacitor 31. Fuse 19 is sized to open at currents much smaller than the expected full load switch current. Fuse 19 is also sized not to clear at currents that could be safely interrupted by the combination of switch contact 18A and the clamp circuit comprising diode 11 and capacitor 15. When contacts 18A and 18B are opened under current and voltage conditions where the energy storage potential of capacitor 15 ($\frac{1}{2}CV^2$) is greater that the energy required to clear fuse 19 ($I^2T$), then fuse 19 is cleared. The basic material value of the invention is that the energy that would have sustained an arc across contacts 18B, as contacts 18B are opened and if fuse 19 were not included, is used to clear fuse 19 by shunting the load current through fuse 19. This function is also predicated on contacts 18B mechanically reaching full separation before fuse 19 is fully cleared. When contacts 18A and 18B are re-closed, capacitor 15 is rapidly discharged through resistor 16 and the switch is rearmed for load-break. If fuse 19 is cleared, the switch has provided the intended load break function and fuse 19 must be replaced before the switch can again conduct current. If fuse 19 remains intact after the switch has opened, the switch provides isolation via the DC blocking capability of capacitor 15.

In some applications, a second switch, not rated for load-break, may be used in series with the switch shown in FIG. 1 to provide additional isolation to augment the capacitive DC isolation provided by capacitor 15. In this case, the second switch must be interlocked with the switch shown in FIG. 1 to only allow the second switch to be opened when the composite switch shown in FIG. 1 is open.

The apparatus shown in FIG. 1 may also comprise an indicator of some type to show that fuse 19 is open and that it must be replaced before the switch can be put back into operation to carry current.

The apparatus shown in FIG. 1 may also comprise an interlock of some type to disable the closure of the switch apparatus when fuse 19 is open.

Figure 2:
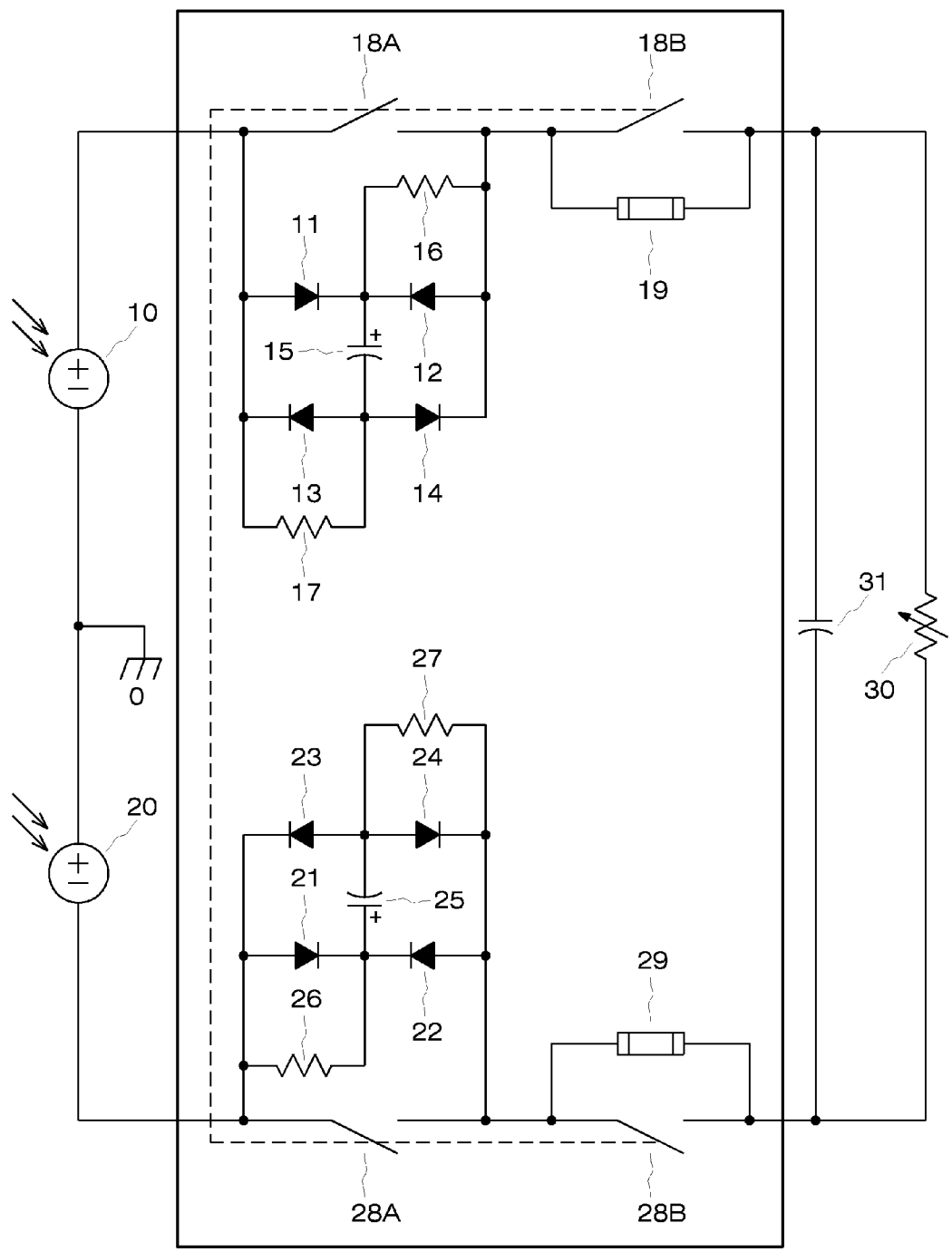
FIG. 2 is an electrical schematic of the preferred embodiment of the invention as a composite double-pole, load-break safety switch capable of interrupting current in two directions.

FIG. 2 shows a schematic for the preferred embodiment of the invention as a disconnect isolation or safety switch connected between a bipolar solar photovoltaic source, connected to earth ground at point 0 and comprising monopolar subarrays 10 and 20 and loads 30 and 31. Capacitive load 31 is modeled as the DC buss capacitance of a typical photovoltaic DC-to-AC power converter. The value of resistive load 30 is a function of the power being processed by the DC-to-AC power converter. The switch comprises all elements within the bounding rectangle illustrated with bold lines. SPST switch contacts 18A, 18B, 28A and 28B are switched together and are controlled by a manually operated lever. The fundamental operation of the circuit shown FIG. 2 is essentially the same as in FIG. 1 with the exceptions that the switch shown in FIG. 2 is (i) capable of interrupting DC current in both directions, including backfeed from capacitor 31 to sources 10 and 20 and (ii) is capable of operating from a bipolar solar array source. In the intended application, as a solar photovoltaic array disconnect switch, the switch will be opened under either non-load break conditions where load 30 is essentially infinite, and no current is flowing through the switch or under load-break emergency conditions where current is flowing through switch contacts 18A, 18B, 28A and 28B prior to opening the switch. Under said non-load break conditions, the voltage of photovoltaic source 10 is the same as the voltage on capacitor 31 such that when said switch contacts are opened, no current flows from photovoltaic sources 10 and 20. Under emergency load-break conditions when said switch contacts are opened, current will flow through diode 11, capacitor 15, diode 14, fuse 19, fuse 29, diode 22, capacitor 25 and diode 23 as capacitors 15 and 25 charge from zero volts to the open circuit pole-to-pole voltage of photovoltaic sources 10 and 20 less the voltage across capacitor 31. Fuses 19 and 29 are sized to open at currents much smaller than the expected full load switch current. Fuses 19 and 29 are also sized not to clear at currents that could be safely interrupted by the combination of switch contact 18A and the clamp circuit comprising diode 11, capacitor 15 and diode 12 in series with the combination of switch contact 28A and the clamp circuit comprising diode 22, capacitor 25 and diode 23. When said switch is opened under current and voltage conditions where the energy storage potential of capacitors 15 and 25 ($\frac{1}{2}CV^2$) is greater that the energy required to clear fuse 19 or fuse 29 ($I^2T$), then fuse 19 or fuse 29 is cleared. The basic material value of the invention is that the energy that would have sustained an arc across contacts 18B and/or 28B contacts as said switch contacts are opened, if fuses 19 and/or 29 were not included, is used to clear fuse 19 or fuse 29 by shunting the load current through fuses 19 and 29. This function is also predicated on said switch contacts mechanically reaching full separation before either fuse 19 or 29 is fully cleared. When said switch contacts are re-closed, capacitors 15 and 25 are rapidly discharged through resistor/diode networks comprising elements 12, 13, 16, 17 and 21, 24, 26, 27, respectively, and the switch is rearmed for load-break. If fuse 19 or fuse 29 is cleared, the switch has provided the intended load break function and fuses 19 or 29 must be replaced before the switch can again conduct current. If fuses 19 and 29 remain intact after the switch has opened, the switch provides isolation via the DC blocking capability of capacitors 15 and 25.

The apparatus shown in FIG. 2 is also capable of interrupting faults to earth ground 0 at the location of loads 30 and 31, in which case where elements associated with switch contacts 18A and 18B or elements associated with switch contacts 28A and 28B may work independently.

In FIG. 2, if DC photovoltaic source 10 and 20 were replaced with AC sources or an ungrounded AC source and capacitive load 31 was omitted, the switch apparatus could also interrupt AC currents. With an added composite pole, for example with additional contacts 38A and 38B with similarly arranged clamp and fuse networks, the switch could be suitable for use with 3-phase AC sources and loads.

The invention simply stated is a passive, arcless, stand-alone DC disconnect switch that does not require control power or control circuitry, which uses a novel composite switch comprising two series-connected, tandem operated, single-pole-single-throw contact sets, wherein one contact set is connected in parallel with a diode/capacitor/resistor clamp circuit and a second contact set is connected in parallel with a fuse. When the contact sets are opened under load, the load current is shunted from the contacts and directed, by the diode, through the uncharged capacitor and the fuse, such that the energy used to charge the capacitor, by the load current, clears the fuse. When the contact set in parallel with the diode/capacitor/resistor clamp is re-closed, the capacitor is quickly discharged by a current limiting resistor and the composite switch is therefore rearmed. In addition, any number of poles may be configured from multiples of the composite switch described herein. If the diode/capacitor/resistor clamp is replaced by a network using a diode bridge and multiple discharge resistors, the invention can serve AC and well as bi-directional DC applications.

What I claim as my invention is:

1. An electrical load-break switch apparatus for interrupting current between a DC source and a load comprising: a manually operated actuator, a first set of electrical contacts, a second set of electrical contacts, a fuse, and a capacitive energy circuit comprising a capacitor and a first diode, wherein said actuator simultaneously opens or closes both said first and second sets of electrical contacts depending on a physical position of the actuator and wherein said first and second sets of electrical contacts are coupled in series and wherein said first set of electrical contacts is coupled in parallel with said capacitive energy circuit and wherein said second set of electrical contacts is coupled in parallel with said fuse such that when the switch apparatus is opened under load, current through said first set of electrical contacts and said second set of electrical contacts is diverted to a path through the fuse, the capacitor and the first diode.

2. The electrical switch apparatus according to claim 1 further comprising a resistor wherein the resistor and said first diode are connected in parallel and said capacitor is connected in series with said parallel connected first diode and resistor.

3. The electrical switch apparatus according to claim 1 further comprising: a second diode, a third diode, a fourth diode, a first resistor and a second resistor and wherein each diode, including said first diode, further comprises an anode and a cathode and wherein said first set of electrical contacts further comprises first and second contacts and wherein a circuit is formed with common couplings between (i) the first contact, the first diode anode, the second diode cathode and a first terminal of the first resistor, (ii) the second contact, a second terminal of the second resistor, the third diode anode and the fourth diode cathode, (iii) a first terminal of the second resistor, the first diode cathode, the third diode cathode and a first terminal of the capacitor and (iv) the second diode anode, the fourth diode anode, a second terminal of the first resistor and a second terminal of the capacitor.

4. The electrical switch apparatus according to claim 3 comprising more than one composite switch pole wherein each composite switch pole comprises a first set of electrical contacts, a second set of electrical contacts, a fuse, a capacitor and a diode.

5. The electrical switch apparatus according to claim 1 comprising more than one composite switch pole wherein each composite switch pole comprises a first set of electrical contacts, a second set of electrical contacts, a fuse, a capacitor and a diode.

6. The electrical switch apparatus according to claim 1 further comprising an indicator to indicate the disposition of the fuse as either intact or open.

7. A method of suppressing arcs across switch contacts when interrupting DC current using a composite manually operated switch comprising a manually operated actuator, two series-connected, tandem operated, single-pole-singlethrow contact sets, wherein one single-pole-single-throw contact set is connected in parallel with a fuse and a second single-pole-single-throw contact set is connected in parallel with a diode/capacitor/resistor clamp circuit comprising a diode coupled in parallel with a resistor and a capacitor coupled in series with the diode and the resistor such that when the contact sets are opened under load to break a load current, the load current is shunted from the contact sets and is directed, by the diode, through the capacitor and through the fuse to clear the fuse and wherein load currents less than the rating of the fuse will be interrupted by the diode/capacitor/resistor clamp circuit.

8. The method of suppressing arcs across switch contacts when interrupting DC current according to claim 7 wherein when the contact set in parallel with the diode/capacitor/resistor clamp is closed, the capacitor is discharged by the resistor, thereby rearming the composite switch for a future load-break event.

* * * * *